US012799958B2

(12) United States Patent
Jay et al.

(10) Patent No.: US 12,799,958 B2
(45) Date of Patent: Nov. 17, 2026

(54) SYSTEM FOR REMOVABLY CONNECTING PORTABLE DEVICES

(71) Applicant: Split Lamp, LLC, Boulder, CO (US)

(72) Inventors: Eli Jay, McKinney, TX (US); Anna Jay, Boulder, CO (US)

(73) Assignee: Split Lamp, LLC, Boulder, CO (US)

(*) Notice: Subject to any disclaimer, the term of this patent is extended or adjusted under 35 U.S.C. 154(b) by 1119 days.

(21) Appl. No.: 17/878,246

(22) Filed: Aug. 1, 2022

(65) Prior Publication Data

US 2023/0040601 A1 Feb. 9, 2023

Related U.S. Application Data

(60) Provisional application No. 63/229,475, filed on Aug. 4, 2021.

(51) Int. Cl.
*F16B 2/00* (2006.01)
*G06F 1/16* (2006.01)
(Continued)

(52) U.S. Cl.
CPC .............. *F16B 2/00* (2013.01); *G06F 1/1607* (2013.01); *H05K 5/0086* (2013.01); *H05K 5/0217* (2013.01)

(58) Field of Classification Search
CPC .... G06F 1/1607; F16B 5/0008; F16B 5/0012; F16B 5/0016; F16B 5/0032;
(Continued)

(56) References Cited

U.S. PATENT DOCUMENTS 8,560,031 B2 10/2013 Barnett et al.
D710,340 S * 8/2014 Wengreen ................. D14/238.1
(Continued)

FOREIGN PATENT DOCUMENTS

DE 10023487 A1 * 11/2001 ......... B60R 13/0206
DE 10136343 A1 * 2/2003 ............. D06F 39/12
(Continued)

OTHER PUBLICATIONS

Oliver Philbrick, "SlideDrive—External Hard Drive mounting system for Laptop"; Thingiverse Website: https://www.thingiverse.com/thing:4822588, Apr. 9, 2021. (Year: 2021).*
(Continued)

*Primary Examiner* — Jonathan P Masinick
(74) *Attorney, Agent, or Firm* — John A. Arsenault; Galen Peterson; Daniel Dubuisson

(57) ABSTRACT

A system for removably making a mechanical connection with a portable device, includes a primary connector configured to be adhered to a surface, the primary connector includes a plate defining a guide slot, a tab-receiving aperture, and a tab-rotation aperture. The system further includes a secondary connector configured to be adhered to a portable device. The secondary connector includes a spacer portion disposed between a base wall and a tab. The tab-receiving aperture is configured to receive the tab of the secondary connector and the tab-rotation aperture is configured to allow rotation of the tab of at least one-quarter turn.

15 Claims, 9 Drawing Sheets

(51) Int. Cl.
*H05K 5/00* (2025.01)
*H05K 5/02* (2006.01)

(58) Field of Classification Search
CPC ...... F16B 5/0036; F16B 5/0052; F16B 5/008; F16B 21/02; F16B 21/09
See application file for complete search history.

(56) References Cited

U.S. PATENT DOCUMENTS

| | | | | | |
|---|---|---|---|---|---|
| D710,363 | S * | 8/2014 | Wengreen | D8/380 | |
| 10,017,129 | B2 * | 7/2018 | Avendano Arenas | F16B 2/20 | |
| 10,039,201 | B2 * | 7/2018 | Wengreen | H05K 7/14 | |
| 10,248,160 | B1 * | 4/2019 | Saragadam | G06F 1/1607 | |
| 10,759,356 | B2 * | 9/2020 | Lee | F16B 5/065 | |
| D910,637 | S * | 2/2021 | Goeller | D14/447 | |
| 10,914,337 | B2 * | 2/2021 | Dobbs | F16B 21/09 | |
| 11,158,354 | B2 * | 10/2021 | Goeller | G11B 33/025 | |
| 11,159,663 | B2 | 10/2021 | Chen | | |
| 2006/0243679 | A1 * | 11/2006 | Dickerson | B43M 99/008 | 211/10 |
| 2009/0019674 | A1 * | 1/2009 | Sato | F16B 21/09 | 24/289 |
| 2012/0127379 | A1 * | 5/2012 | Wengreen | H05K 5/0204 | 248/316.1 |
| 2015/0192160 | A1 * | 7/2015 | Gong | F16B 5/065 | 411/360 |
| 2015/0219274 | A1 * | 8/2015 | Fields | F16M 11/041 | 248/205.1 |

FOREIGN PATENT DOCUMENTS

| | | | | |
|---|---|---|---|---|
| DE | 102012110912 A1 * | 5/2014 | F16B 21/09 |
| DE | 20 2022 101 254 U1 | 4/2022 | |
| EP | 0641939 A1 * | 3/1995 | F16B 21/09 |
| FR | 2873768 A1 * | 2/2006 | F16B 5/0628 |
| GB | 2198177 A * | 6/1988 | B66C 3/005 |

OTHER PUBLICATIONS

Oliver Philbrick, “SlideDrive—External Hard Drive mounting system for Laptop”; 3D Go App Website, https://3dgo.app/models/thingiverse/4822588, Apr. 9, 2021. Includes 3D print files. (Year: 2021).*
Anna Jay, “DriveSlide Main Video”—Vimeo—https://vimeo.com/443425567, Jul. 31, 2020. (Year: 2020).*
3D Go—Slide Drive (Year: 2021).*
Vimeo Video of DriveSlide (Year: 2020).*
Thingiverse—Slide Drive (Year: 2021).*

* cited by examiner

SYSTEM FOR REMOVABLY CONNECTING PORTABLE DEVICES

CROSS-REFERENCE TO RELATED PATENT APPLICATIONS

This application is a non-provisional patent application which, pursuant to 35 U.S.C. 119(e), claims priority to and the benefit of U.S. Provisional Patent Application No. 63/229,475, filed Aug. 4, 2021, which is incorporated by reference herein in its entirety.

BACKGROUND

Conventional external devices, such as an external hard drive, use cables to communicate with a portable computing device, such as a laptop computer. The cables often anchor users to one workspace or area once the user plugs the cable into the portable computing device at one end and the external device at the other end. A user's mobility may be limited for the entire time the user's laptop is plugged into the external device using the cable. A mechanical connection between the portable computing device and the external accessory would restore mobility to the user because the user could move the portable computing device and the external device together as an assembled unit. The connector should also allow easy separation of the two devices.

SUMMARY

According to a first aspect, a system for removably making a mechanical connection with a portable device, includes a primary connector configured to be adhered to a surface, the primary connector comprising a plate defining a guide slot, a tab-receiving aperture, and a tab-rotation aperture. The system further includes a secondary connector configured to be adhered to a portable device, the secondary connector comprising a spacer portion disposed between a base wall and a tab. The system also includes wherein the tab-receiving aperture is configured to receive the tab of the secondary connector and the tab-rotation aperture is configured to allow rotation of the tab of at least one quarter turn.

According to some embodiments, the plate of the primary connector includes a pair of chamfers disposed proximate the guide slot.

In other embodiments, the primary connector further includes a forward stop and a rear stop each configured to arrest rotation of the tab.

According to yet another embodiment, each of the primary connector and the secondary connector are formed of ABS.

In some other embodiments, the system further includes a first sheet of adhesive material secured to a base surface of the primary connector.

In other embodiments, the system further includes a second sheet of adhesive material secured to a base wall of the secondary connector.

According to some embodiments, the surface is part of a laptop computer.

In another embodiment, the surface is part of a countertop.

BRIEF DESCRIPTION OF THE DRAWINGS

The disclosure will become more fully understood from the following detailed description, taken in conjunction with the accompanying figures, wherein like reference numerals refer to like elements, in which.

The drawings are not necessarily to scale and certain features may be shown exaggerated in scale or in somewhat schematic form in the interest of clarity and conciseness.

DETAILED DESCRIPTION

Before turning to the figures, which illustrate certain exemplary embodiments in detail, it should be understood that the present disclosure is not limited to the details or methodology set forth in the description or illustrated in the figures. It should also be understood that the terminology used herein is for the purpose of description only and should not be regarded as limiting.

Figure 1:
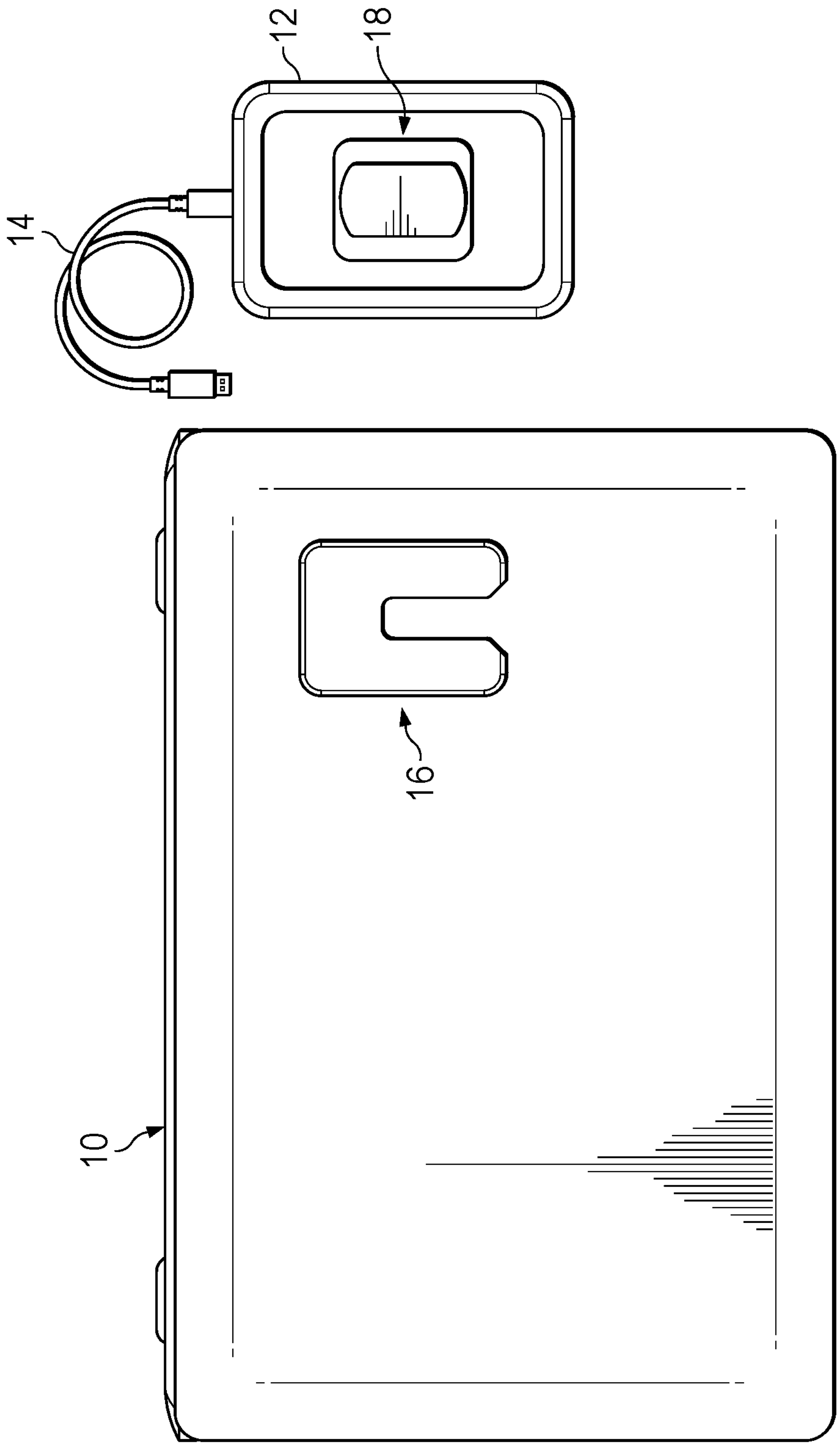
FIG. 1 is a top, plan view of an embodiment of a system for removably connecting portable devices according to the present disclosure.

FIG. 1 illustrates a system for removably connecting portable devices. A first portable device 10 may be a laptop computer. A portable accessory 12 is external to the portable device 10. According to the teachings of the present disclosure, the portable accessory 12 may be removably coupled to the portable device 10 using the removable connector system disclosed. According to certain embodiments, the portable accessory 12 may be an external hard drive or other external device that is used in connection with the personal computer 10, for example the portable hard drive is in data communication with the portable laptop computer 10 through a data cable 14, for example a USB cable. The data cable 14 may be generally short because the portable accessory 12 is mechanically coupled to the portable computing device 10. Thus, the user does not extend the data cable 14, when moving the portable computing device 10 from one location to another because the portable computing device 10 is mechanically coupled to the portable accessory 12, and they can be moved together.

Figure 5B:
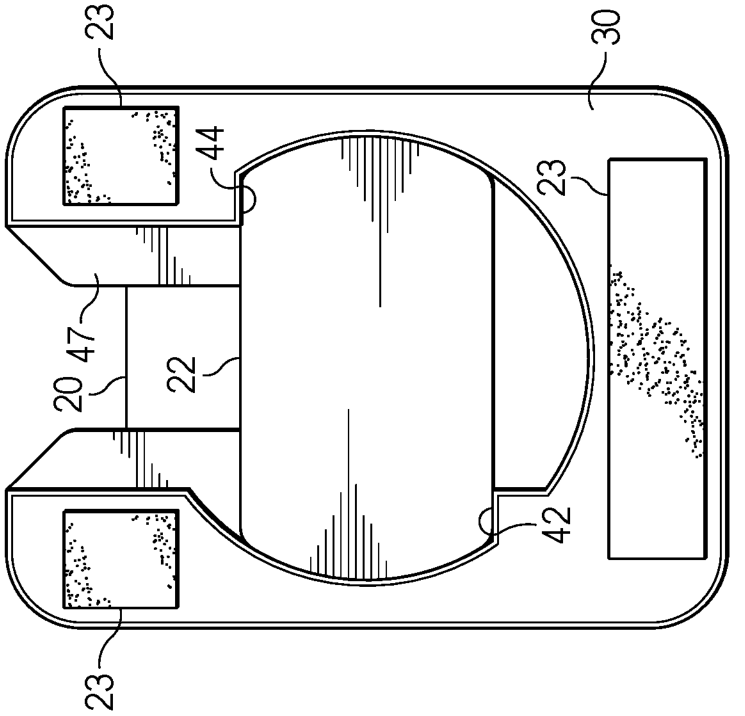
FIGS. 5A and 5B are top and bottom views of an embodiment of a system for removably connecting portable devices in a locked position according to the present disclosure.
Figure 5A:
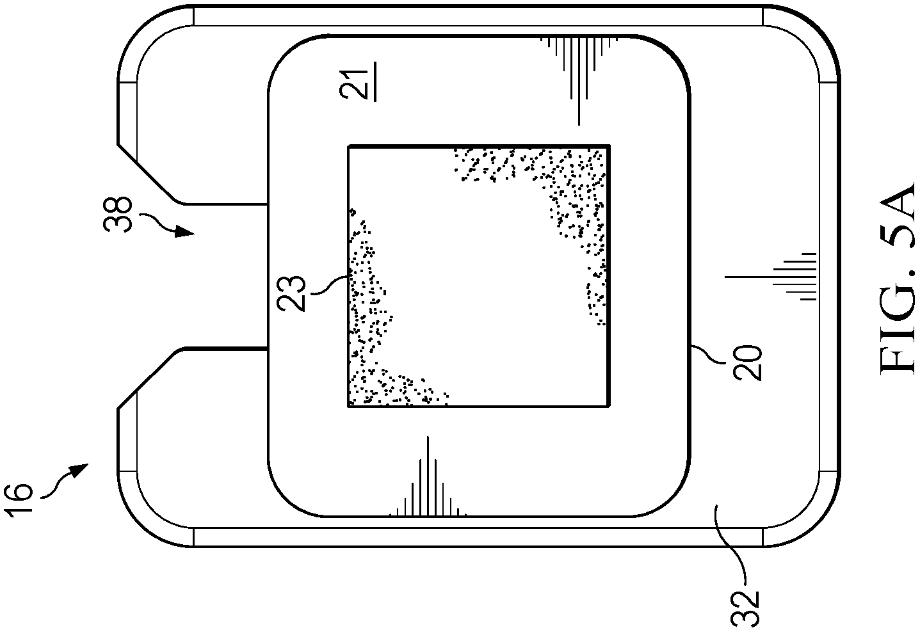

A primary connector or receptacle 16 is secured to a portable device 10. According to certain embodiments, the receptacle 16 may be adhered to the portable device 10 using an adhesive material. For example, the adhesive material may be a double-sided tape 23. As shown in FIGS. 5A and 5B, one side of the double-sided tape 23 may be applied to the receptacle 16 during manufacturing such that it maintains a generally permanent bond. The exposed side of the double-sided tape 23 is provided to the end user with a backing material that may be removed to expose a second adhesive side that is pressure sensitive, which can be secured to the portable device 10 by applying pressure to the receptacle 16 when in contact with the portable device 10. A secondary connector or insert 18 may also include a double-sided tape 23 that is generally permanently applied during manufacturing and is supplied to the user with a backing material that is removed to expose pressure sensitive adhesive. The pressure sensitive adhesive of the double-sided tape 23 secures the insert 18 to the portable accessory 12. According to an embodiment, a suitable double-sided tape 23 is manufactured by 3M of St. Paul, Minnesota. According to an embodiment, the injection molded parts may include a recess corresponding to the size and shape of the double-sided tape 23.

According to certain embodiments, the receptacle 16 has a size and shape similar to a credit card. The receptacle 16 is also generally thin such that it does not add excess bulk to the portable device 10 to which it is attached. According to an embodiment, the receptacle 16 may have dimensions of 3"×2.25"×0.125".

Figure 2A:
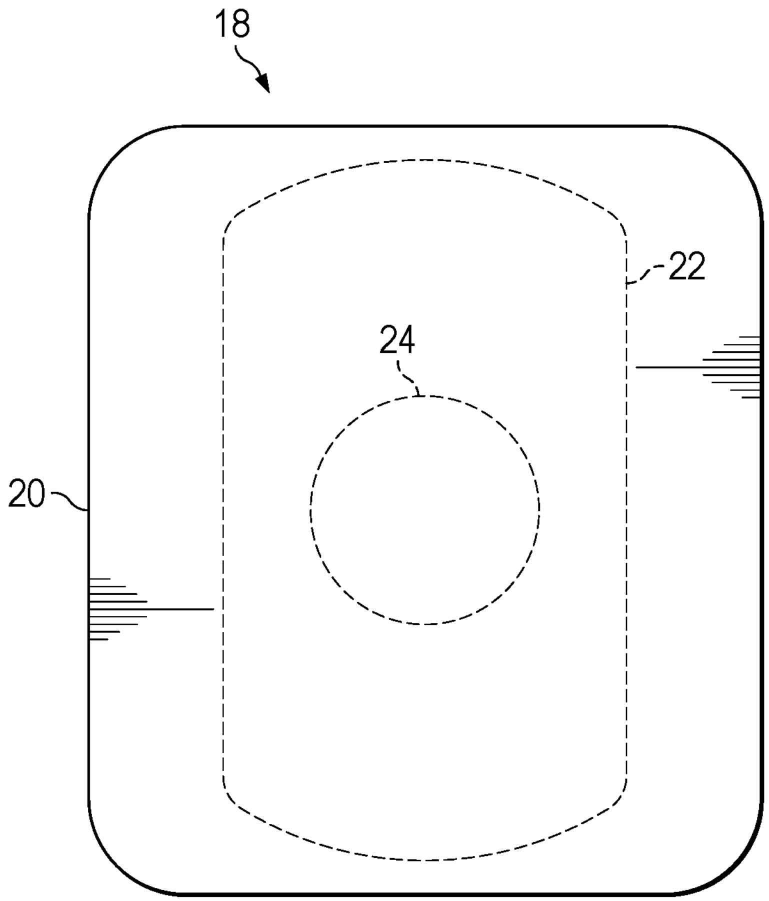
FIGS. 2A-2C are orthogonal views (top, bottom, and side) of an embodiment of an insert according to the present disclosure.
Figure 2C:
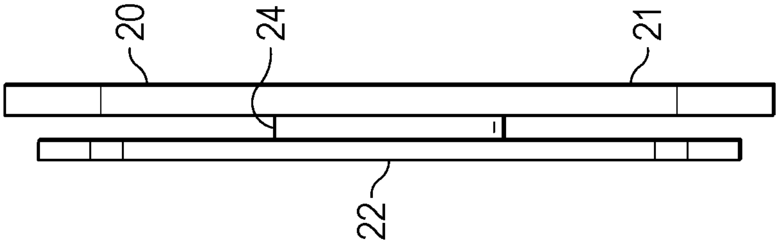
Figure 2B:
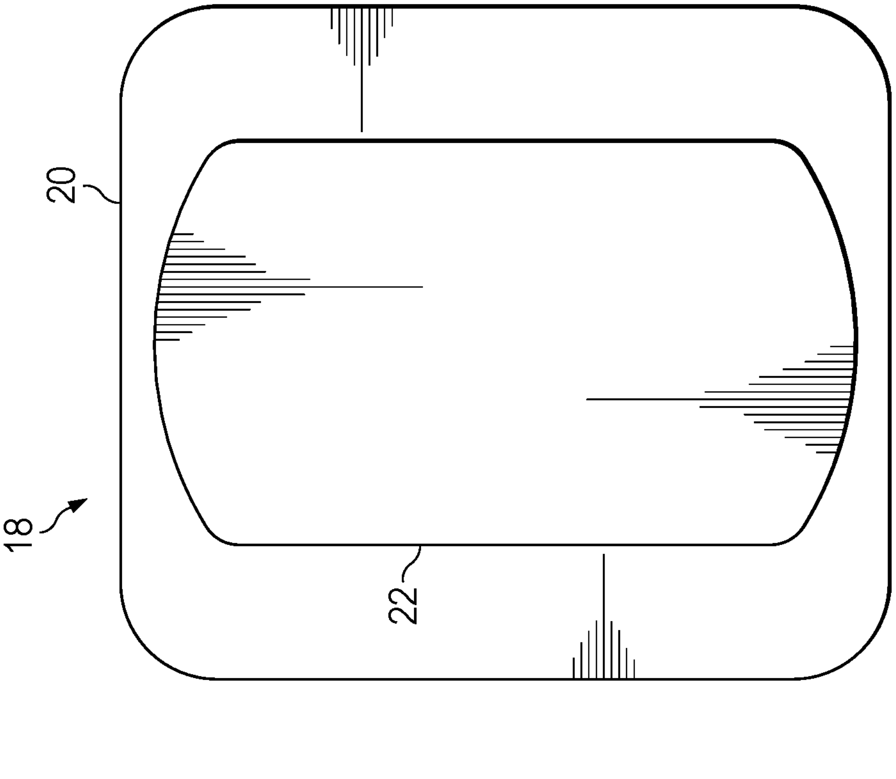

FIGS. 2A, 2B, and 2C show various views of the secondary connector or insert 18 of the system for removably connecting portable devices. FIG. 2A is an overhead plan view of the insert 18. FIG. 2B is a plan view of the underside of the insert 18. FIG. 2C is a side view of the insert 18. The insert 18 may have dimensions of 2"×1.75"×0.25". The insert 18 may be a thin-walled polymeric part. It may be formed using any suitable polymeric forming process, for example injection molding. The insert 18 may be formed of any suitable polymeric material, for example acrylonitrile butadiene styrene (ABS). The insert 18 includes a base wall 20 and a tab 22. A spacer portion 24 separates the tab 22 from the base wall 20. According to one embodiment, the base wall 20, the tab 22, and the spacer 24 are formed by a single mold such that they are integral to a single injection molded part. According to alternate embodiments, the base wall 20 and the spacer 24 may be a molded part separate from the tab 22 and joined together subsequent to molding, as described in more detail with respect to FIG. 7. The base wall 20 is a generally rectangular or square plate with rounded corners. The double-sided tape 23 is generally permanently secured to an exposed surface 21 of the base wall 20. The spacer portion 24 extends from the base wall 20 and separates the tab 22 from the base wall 20. The tab 22 is configured to be received by the receptacle 16 and rotated 90° to secure the tab 22 within the receptacle 16, as further described below. According to an embodiment, the spacer portion 24 may be generally circular to allow unobstructed rotation within the receptacle 16.

Figure 3B:
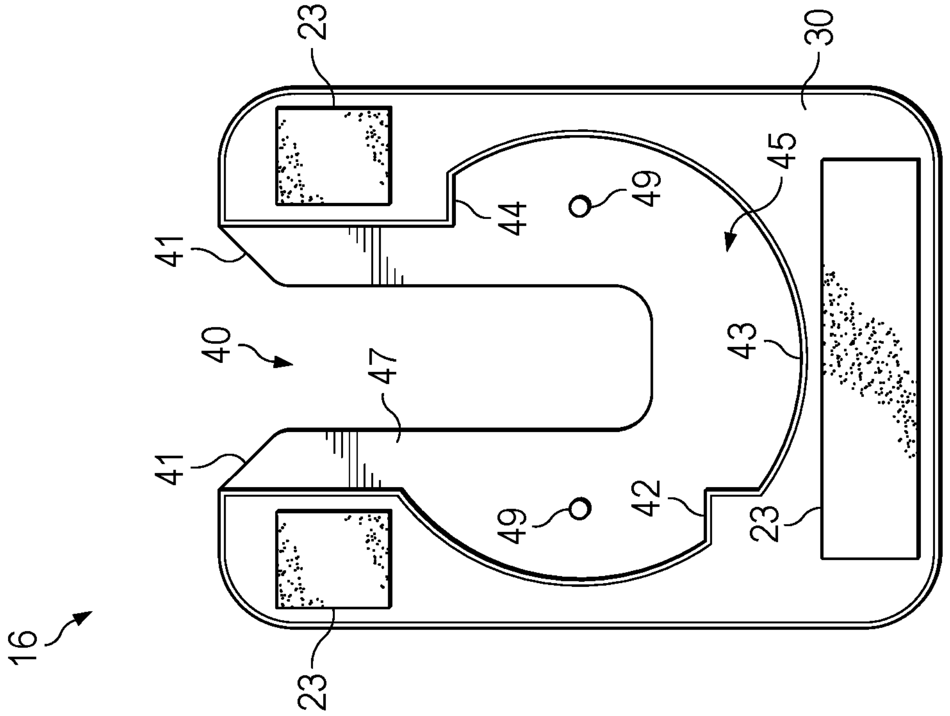
FIGS. 3A-3B are top and bottom views of an embodiment of a receptacle according to the present disclosure.
Figure 3A:
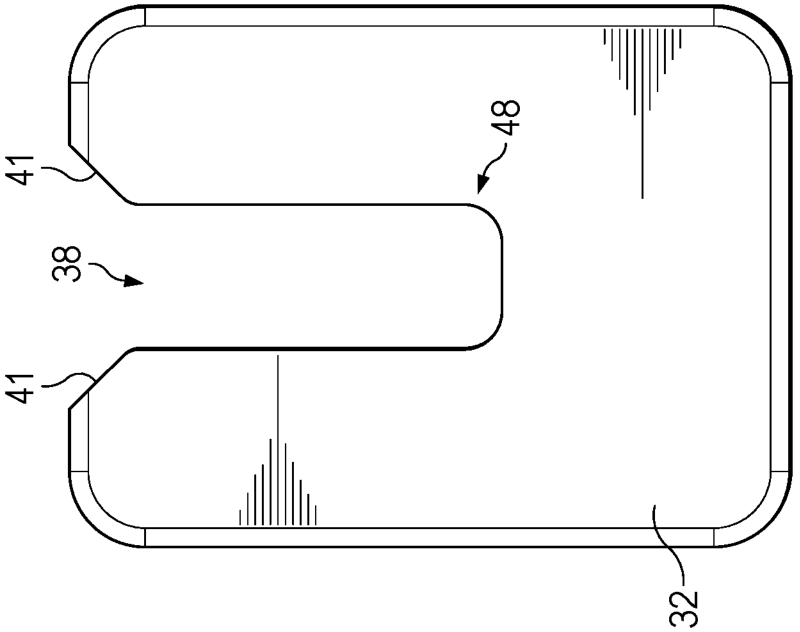

Reference is now made to FIGS. 3A-3B, which illustrate top and bottom plan views of the receptacle 16 of the system for removably connecting portable devices. Specifically, FIG. 3A shows a front side overhead, plan view of the receptacle 16 whereas FIG. 3B shows a plan view of the underside of the receptacle 16. Similar to the insert 18, the receptacle 16 is a thin-walled polymeric part. The receptacle 16 may be formed using any suitable polymeric forming process, for example injection molding. As one example, the receptacle 16 may be formed of injection molded ABS.

The receptacle 16 is generally a flat plate that defines a guide slot 38, a tab-receiving aperture 40, and a tab rotation aperture 45. The receptacle 16 has a thickness that allows the receptacle 16 to receive the tab 22, for example 0.16 inches. The flat plate includes a base surface 30 to which the double-sided tape 23 is permanently affixed. The tab-receiving aperture 40 and the tab rotation aperture 45 each have a depth that is generally equal to a thickness of the tab 22 of the insert 18. The tab-receiving aperture 40 is disposed forward of the tab rotation aperture 45. As such, the tab 22 of the insert 18 may be received, rotated, and secured between an inner surface 47 of the receptacle 16 and the lid of the portable computing device 10, such as a laptop computer, such that the tab 22 is generally flush with the base surface 30.

The guide slot 38 has a width configured to correspond to the spacer portion 24 of the insert 18. The guide slot 38 includes a pair of chamfers 41 to facilitate receiving and proper alignment between the spacer portion 24 and the guide slot 38. Upon receiving the spacer portion 24 between the walls of the guide slot 38, the base wall 20 of the insert 18 is disposed above the receptacle 16, and the tab 22 of the insert 18 is disposed within the tab-receiving aperture 40 between the receptacle 16 and the surface to which the receptacle 16 is adhered.

Figure 4B:
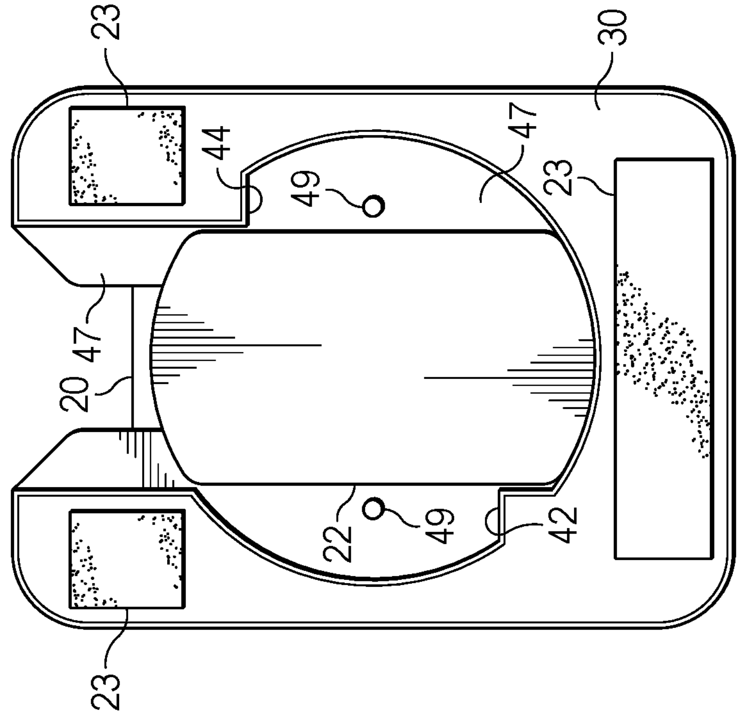
FIGS. 4A and 4B are top and bottom views of an embodiment of a system for removably connecting portable devices in an unlocked position according to the present disclosure.
Figure 4A:
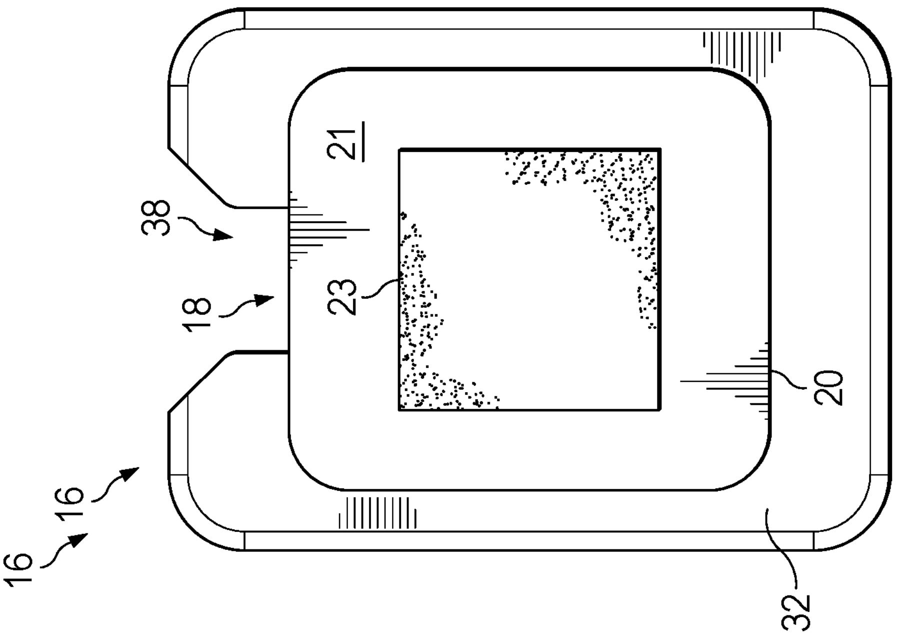

FIGS. 4A and 4B show top and bottom views of the assembly of the receptacle 16 and the insert 18. FIGS. 4A and 4B show the tab 22 upon insertion into the receptacle 16 in an unlocked position, and FIGS. 5A and 5B show the tab 22 rotated into a locked position with respect to the receptacle 16. The tab 22 is inserted into the tab-receiving aperture 40 simultaneously with the spacer portion 24 being inserted in the guide slot 38 until the tab 22 contacts an arcuate wall 43 of the tab rotation aperture 45. The tab-receiving aperture 40 has a width that is wider than the guide slot 38 and corresponds to the width of the tab 22.

The tab rotation aperture 45 is sized and shaped to allow the tab 22 to be rotated one-quarter turn or 90°. The spacer portion 24 of the insert 18 is simultaneously rotated within the rearward portion 48 of the guide slot 38. For example, the insert 18 can be rotated clockwise or counterclockwise approximately 90°.

According to an embodiment, rotating the insert 18 in one rotational direction, for example counter-clockwise 90°, causes the tab 22 to contact a forward stop 44 and a rear stop 42. The forward stop 44 is disposed generally diagonally across the tab-rotation aperture 45 from the rear stop 42. The forward stop 44 together with the rear stop 42 arrest the rotation of the tab 22. With the tab 22 in the rotated position shown in FIG. 5B, the insert 18 is immobilized from all but rotational motion. Thus, the insert 18 is blocked from moving back through the guide slot 38 in the direction opposite from which it was inserted into the receptacle 16. Accordingly, the insert 18 is removably secured within the receptacle 16. Because the receptacle 16 is adhered to the portable device 10, and the insert 18 is adhered to the portable accessory 12, the portable accessory 12 is removably connected mechanically to the portable device 10. To remove the insert 18 from the receptacle 16, the portable accessory 12, and thus the insert 18, is rotated the opposite direction (clockwise) 90°, or one quarter turn. The rotation of the insert 18 positions the tab 22 in line with the tab-receiving aperture 40 and allows the insert 18 to be removed from the receptacle 16.

According to an alternate embodiment, the inner surface 47 of the receptacle 16 may include one or more projections 49 that correspond to one or more recesses or dimples (not shown) formed in the tab 22 of the insert 18. The projections 49 and recesses may be positioned such that when the insert 18 is inserted and rotated a quarter turn, the recesses receive the projections 49. In this manner, the user receives a tactile and possibly an audible indication that the insert 18 is in the locked position. Alternatively, the tab 22 may include the projections and the inner surface 47 of the receptacle may include the recesses.

It should be understood that the disclosed system for removable connecting portable devices is not limited to use with laptop computers and external accessories. For example, the receptacle 16 may be adhered to any work surface, such as the surface of a desk or countertop. The insert 18 may then be secured to any device desired to be maintained with the receptacle 16. The insert 18 may then be received and rotated within the receptacle 16 between the receptacle 16 and the surface to which the receptacle 16 is secured. In this manner, the device may be secured at a particular location of the desk surface or countertop. Moreover, one receptacle 16 may be used with multiple inserts 18 that are each attached to different external devices. Thus, the same receptacle 16 may be used to connect mechanically with multiple external devices.

Figure 6:
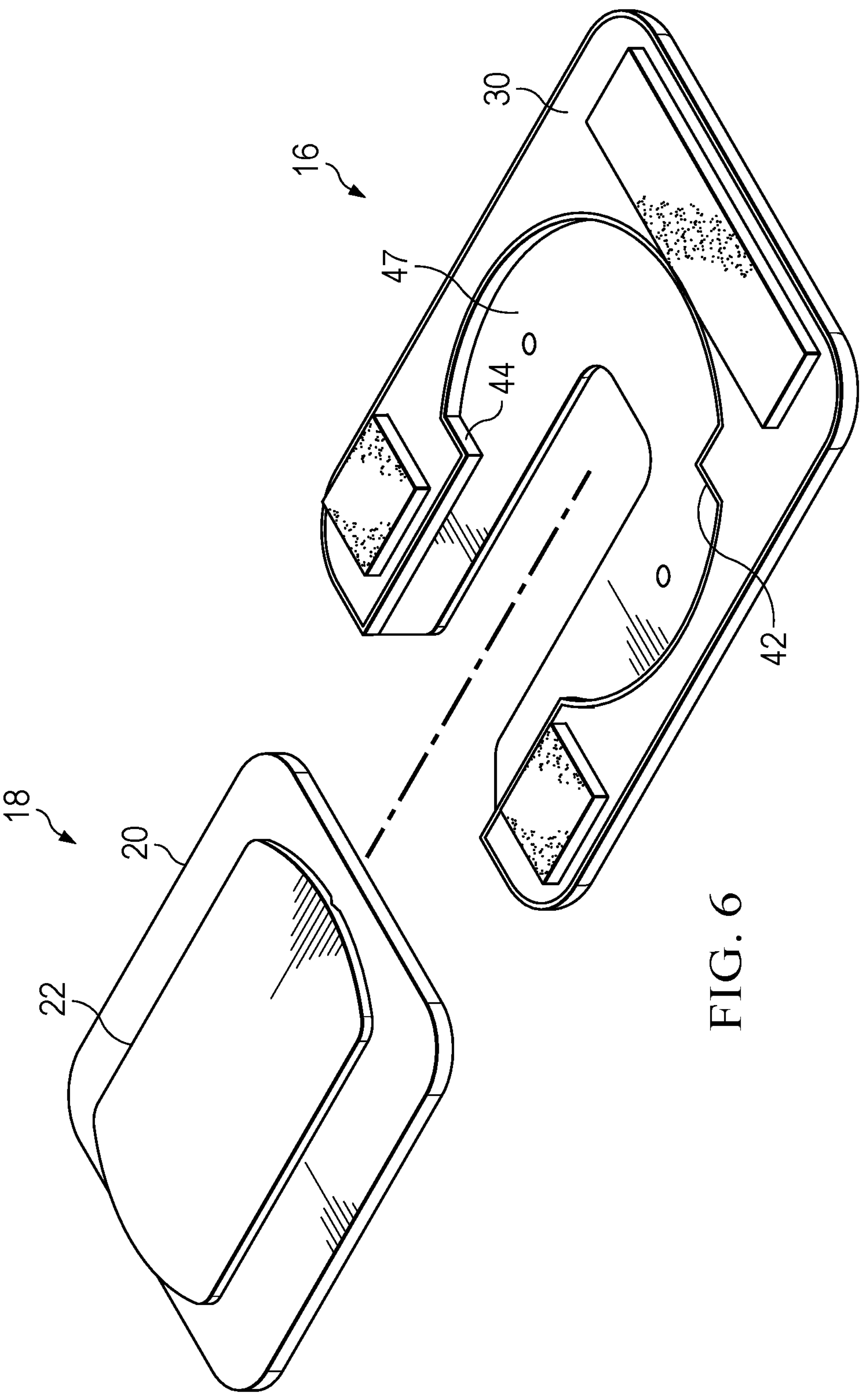
FIG. 6 is a perspective view of an embodiment of a system for removably connecting portable devices showing a secondary connector in position to be received by a primary connector according to the present disclosure.
Figure 7:
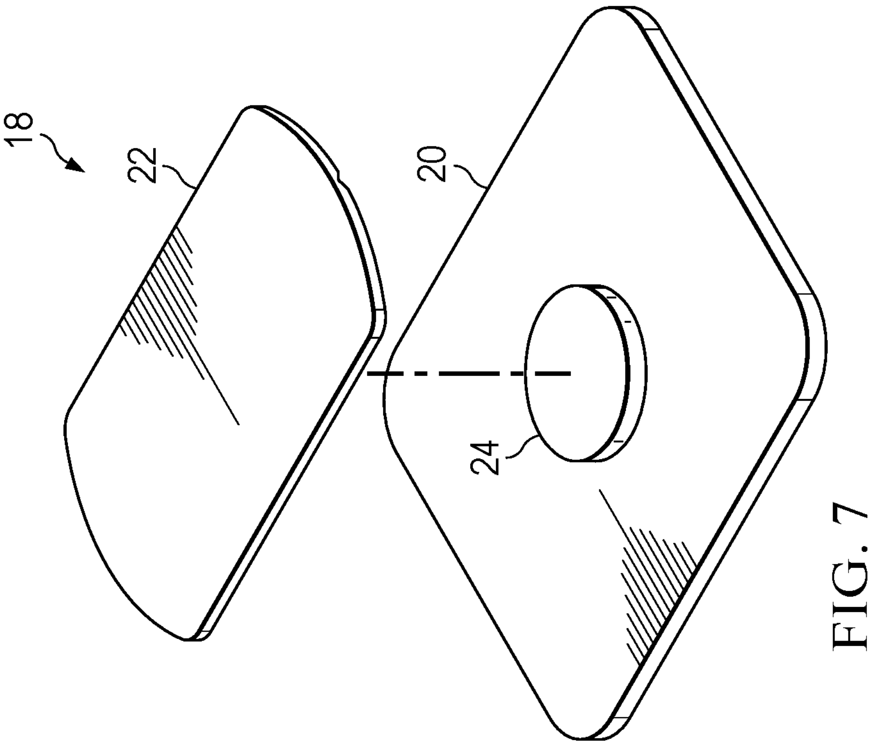
FIG. 7 is an exploded, perspective view of an embodiment of a secondary connector of a system for removably connecting portable devices according to the present disclosure.

Reference is now made to FIG. 6, which depicts a perspective, disassembled view of the receptacle 16 and the insert 18. FIG. 7 is a perspective, exploded view of an alternate embodiment of the insert 18. According to the embodiment illustrated in FIG. 7, the insert 18 is a formed of a base wall 20 and a tab 22 with the spacer 24 formed to extend from a surface of the base wall 20. The spacer 24 may be in the form of a boss that projects from the base wall 20 and is received in a corresponding recess or through hole in the tab 22. According to an alternate embodiment, the base wall 20 may include a recess or hole and the spacer portion 24 may be formed integrally with the tab 22. In either embodiment, the spacer 24 or a portion of the spacer 24 may be joined to either the base wall 20 or the tab 22 using ultrasonic welding, or any other suitable process for permanently joining thin-walled plastic parts.

Figure 8:
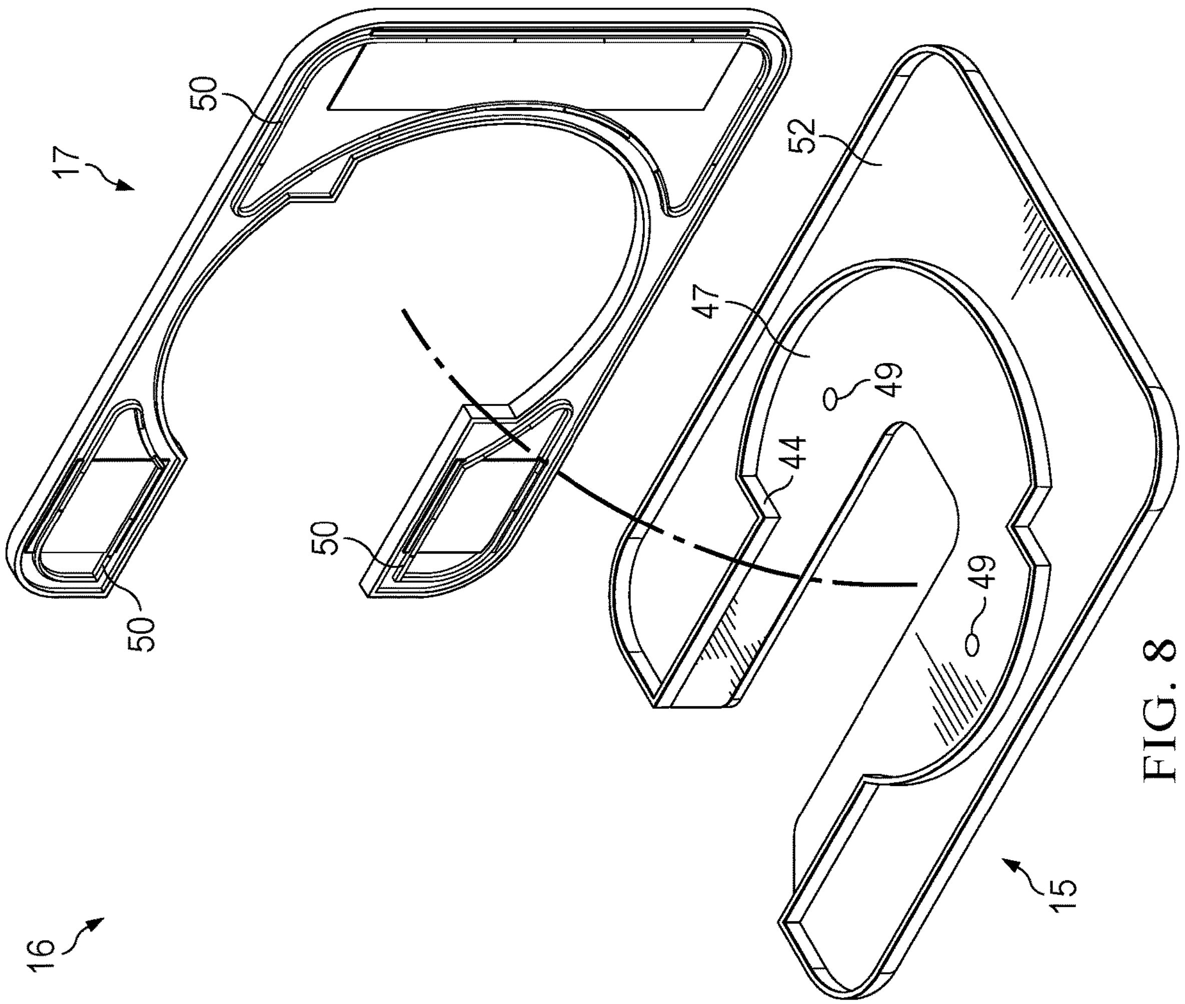
FIG. 8 is an exploded, perspective view of an embodiment of a primary connector of a system for removably connecting portable devices according to the present disclosure.

FIG. 8 is an exploded, perspective view of an embodiment of the receptacle 16. According to an embodiment, the receptacle 16 may be formed from a front panel 15 and a rear panel 17 that are separately injection molded and joined together using any suitable technique for joining thin-walled plastic parts, such as ultrasonic welding. The rear panel 15 includes ribs 50. The ribs 50 function to facilitate ultrasonic welding techniques with joining the front panel 15 to the rear panel 17. The tips of the ribs 50 generally extend beyond the thickness of the final thickness of the receptacle 16 prior to the ultrasonic welding procedure and are melted to bond with the inner surface 52 of the front panel 15 during the ultrasonic welding procedure to the final thickness of the receptacle 16. In many embodiments, only some portions of the ribs 50 have tips that extend beyond the final thickness of the receptacle 16 prior to the ultrasonic welding procedure and other adjacent portions of the ribs 50 that have tips that only extend to the final thickness of the receptacle 16. The tips of the ribs 50 function to focus the energy of the ultrasonic welding procedure onto a small surface area. According to an alternate embodiment, the receptacle may be formed as a single injection molded part, and the sonic welding procedure may be omitted.

Although embodiments of a removable connector system have been described in detail, those skilled in the art will also recognize that various substitutions and modifications may be made without departing from the scope and spirit of the appended claims.

In the foregoing description of certain embodiments, specific terminology has been resorted to for the sake of clarity. However, the disclosure is not intended to be limited to the specific terms so selected, and it is to be understood that each specific term includes other technical equivalents which operate in a similar manner to accomplish a similar technical purpose. Terms such as "left" and right", "front" and "rear", "above" and "below" and the like are used as words of convenience to provide reference points and are not to be construed as limiting terms.

In this specification, the word "comprising" is to be understood in its "open" sense, that is, in the sense of "including", and thus not limited to its "closed" sense, that is the sense of "consisting only of". A corresponding meaning is to be attributed to the corresponding words "comprise", "comprised" and "comprises" where they appear.

As utilized herein with respect to numerical ranges, the terms "approximately," "about," "substantially," and similar terms generally mean +/−10% of the disclosed values. When the terms "approximately," "about," "substantially," and similar terms are applied to a structural feature (e.g., to describe its shape, size, orientation, direction, etc.), these terms are meant to cover minor variations in structure that may result from, for example, the manufacturing or assembly process and are intended to have a broad meaning in harmony with the common and accepted usage by those of ordinary skill in the art to which the subject matter of this disclosure pertains. Accordingly, these terms should be interpreted as indicating that insubstantial or inconsequential modifications or alterations of the subject matter described and claimed are considered to be within the scope of the disclosure as recited in the appended claims.

The term "coupled" and variations thereof, as used herein, means the joining of two members directly or indirectly to one another. Such joining may be stationary (e.g., permanent or fixed) or moveable (e.g., removable or releasable). Such joining may be achieved with the two members coupled directly to each other, with the two members coupled to each other using a separate intervening member and any additional intermediate members coupled with one another, or with the two members coupled to each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above.

References herein to the positions of elements (e.g., "top," "bottom," "above," "below") are merely used to describe the orientation of various elements in the figures. It should be noted that the orientation of various elements may differ according to other exemplary embodiments, and that such variations are intended to be encompassed by the present disclosure.

In addition, the foregoing describes some embodiments of the disclosure, and alterations, modifications, additions and/or changes can be made thereto without departing from the scope and spirit of the disclosed embodiments, the embodiments being illustrative and not restrictive.

Furthermore, the disclosure is not to be limited to the illustrated implementations, but to the contrary, is intended to cover various modifications and equivalent arrangements included within the spirit and scope of the disclosure. Also, the various embodiments described above may be implemented in conjunction with other embodiments, e.g., aspects of one embodiment may be combined with aspects of another embodiment to realize yet other embodiments. Further, each independent feature or component of any given assembly may constitute an additional embodiment.

What is claimed is:

1. A system for removably making a mechanical connection with a portable device, comprising:

a primary connector configured to be adhered to a surface, the primary connector comprising a plate defining a guide slot, a tab-receiving aperture, and a tab-rotation aperture;

a secondary connector configured to be adhered to a portable device, the secondary connector comprising a spacer portion disposed between a base wall and a tab; and wherein the tab-receiving aperture is configured to receive the tab of the secondary connector and the tab-rotation aperture is configured to allow rotation of the tab of at least one quarter turn.

2. The system of claim 1 wherein the plate of the primary connector comprises a pair of chamfers disposed proximate the guide slot.

3. The system of claim 1 wherein the primary connector further comprises a forward stop and a rear stop each configured to arrest rotation of the tab.

4. The system of claim 1 wherein each of the primary connector and the secondary connector is formed of ABS.

5. The system of claim 1 further comprising a first sheet of adhesive material secured to a base surface of the primary connector.

6. The system of claim 5 further comprising a second sheet of adhesive material secured to the base wall of the secondary connector.

7. The system of claim 1 wherein the surface is part of a laptop computer.

8. The system of claim 1 wherein the surface is part of a countertop.

9. A system for removably making a mechanical connection with a portable device, comprising:

a primary connector comprising a first strip of adhesive tape secured to a base surface of the primary connector, the primary connector comprising a plate defining a guide slot, a tab-receiving aperture, and a tab-rotation aperture, a forward stop and a rear stop being disposed in the tab-rotation aperture;

a secondary connector comprising a second strip of adhesive tape secured to a base wall of the secondary connector, the secondary connector comprising a spacer portion disposed between the base wall and a tab; and wherein the tab-receiving aperture is configured to receive the tab of the secondary connector and the tab-rotation aperture is configured to allow rotation of the tab of at least one quarter turn and the forward stop and the rear stop each being configured to arrest rotation of the tab.

10. The system of claim 9 wherein the plate of the primary connector comprises a pair of chamfers disposed proximate the guide slot.

11. The system of claim 9 wherein each of the primary connector and the secondary connector is formed of ABS.

12. The system of claim 9 wherein the first strip of adhesive tape comprises a removable backing material.

13. A connector system, comprising:

a primary connector comprising a first strip of adhesive tape secured to a base surface of the primary connector and to a laptop computer, the primary connector comprising a plate defining a guide slot, a tab-receiving aperture, and a tab-rotation aperture, a forward stop and a rear stop being disposed in the tab-rotation aperture;

a secondary connector comprising a second strip of adhesive tape secured to a base wall of the secondary connector and to a portable computer accessory, the secondary connector comprising a spacer portion disposed between the base wall and a tab; and wherein the tab-receiving aperture is configured to receive the tab of the secondary connector and the tab-rotation aperture is configured to allow rotation of the tab of at least one quarter turn and the forward stop and the rear stop being each configured to arrest rotation of the tab.

14. The connector system of claim 13 wherein the plate of the primary connector comprises a pair of chamfers disposed proximate the guide slot.

15. The connector system of claim 13 wherein each of the primary connector and the secondary connector is formed of ABS.

* * * * *